United States Patent [19]
Kotani et al.

[11] Patent Number: 4,980,754
[45] Date of Patent: Dec. 25, 1990

[54] PACKAGE FOR SUPERCONDUCTING DEVICES

[76] Inventors: Seigo Kotani, Zama-Iriya Heights 3-503, 1-147-1, Iriya, Zama-shi, Kanagawa, 228; Hiroyuki Sakai, 1-9, Kojima, Nagano-shi, Nagano, 381; Toshikazu Takenouchi, 2-5-9, Nishi-machi, Nakano-shi, Nagano, 383; Fumio Miyagawa, 2681-41, Higashi-sainami, Nagano-shi, Nagano, 388, all of Japan

[21] Appl. No.: 428,673

[22] Filed: Oct. 30, 1989

[30] Foreign Application Priority Data

Nov. 2, 1988 [JP] Japan .................. 63-276023

[51] Int. Cl.$^5$ .................. H01L 39/02; H01L 23/02; H01L 25/04
[52] U.S. Cl. .................. 357/83; 357/80; 357/81; 361/385; 174/154
[58] Field of Search .................. 357/5, 82, 83, 80, 81; 174/15.4; 361/385

[56] References Cited

U.S. PATENT DOCUMENTS

| | | | |
|---|---|---|---|
| 4,245,273 | 1/1981 | Feinberg et al. | 357/82 |
| 4,734,820 | 3/1988 | Lauffer et al. | 357/83 |
| 4,805,420 | 2/1989 | Porter et al. | 357/83 |

FOREIGN PATENT DOCUMENTS

| | | |
|---|---|---|
| 0213421 | 3/1987 | European Pat. Off. |
| 59-144190 | 8/1984 | Japan .................. 357/5 |

OTHER PUBLICATIONS

*Popular Electronics* (Apr. 1967); pp. 85, 106.
IBM Technical Disclosure Bulletin, vol. 18, No. 4, Sep. 1975; "Close-Cycle Liquid Nitrogen Refrigeration System for Low-Temperature Computer Operation"; by V. L. Rideout; pp. 1226-1229.
IEEE Spectrum, May 1979, "Computing at 4 Degrees Kelvin", By: Dr. Wilhelm Anacker.

*Primary Examiner*—J. Carroll
*Attorney, Agent, or Firm*—Armstrong, Nikaido, Marmelstein, Kubovcik and Murray

[57] ABSTRACT

A package for superconducting devices, enabling signal transmission at a small propagation delay between superconducting devices provided within a heat insulating vacuum vessel, and semiconductor devices provided outside the heat insulating vacuum vessel. The package comprises a heat insulating vacuum vessel capable of maintaining the interior thereof at a low temperature, a substrate having mounted thereon superconducting devices and disposed within the heat insulating vacuum vessel, another substrate having mounted thereon semiconductor devices and disposed outside the heat insulating vacuum vessel, and film cables electrically connecting the respective circuit patterns of these substrates. Since the thickness of the film cables are very small, the rate of influx of heat that flows into the heat insulating vacuum vessel can be limited to a low value.

9 Claims, 6 Drawing Sheets

PACKAGE FOR SUPERCONDUCTING DEVICES

BACKGROUND OF THE INVENTION

The present invention relates generally to a package suitable for encapsulating electronic devices which must be cooled by a cryogen and, more particularly, to a package suitable for encapsulating superconducting devices, such as Josephson devices.

Recently, a superconducting integrated circuit for a high-speed computer, incorporating superconducting devices, such as Josephson junction devices using Nb have been developed. The Josephson effect is very important in the application of superconductors to the field of electronics. A SQUID (superconducting quantum interference device) for high-sensitivity magnetic field detection, as well as the superconducting integrated circuit, employs the Josephson effect. Currents that flow across a junction of a superconductor/insulator/superconductor structure are classified into Josephson currents that flow without voltage drop, and currents that flow with a finite voltage Vg corresponding to the band gap of the superconductor. The Josephson junction device can be used as a device for logical operation by representing a binary digit "0" by 0 volt, and a binary digit "1" by the finite voltage Vg. Magnetic flux $\phi$ arrested by a superconducting loop including the junction is quantized by a magnetic flux quantum $\phi_0$ as the unit and is expressed by $\phi = n \phi_0$ (n is an integer). The Josephson junction device can be used as a digital storage device by representing binary digits "0" and "1" respectively by a state where $n = -1$ and a state where $n = 1$.

A logic circuit employing superconducting devices, such as Josephson junction devices, is capable of operating at a high speed at a low power consumption, and hence a high-speed processor can easily be realized by the employment of such a logic circuit. High-speed signal exchange between such a high-speed processor and electronic devices, such as LSIs, disposed outside a low-temperature atmosphere must be possible for the effective use of the high-speed processor, or it is impossible to make the most of the advantages of the high-speed processor even if only the high-speed processor is capable of operating at a high operating speed. The arrangement of a package encapsulating superconducting devices is very important for high-speed signal transmission.

Generally, liquid helium (He) is used as a cryogen to cool the superconducting device for operation. The superconducting device is immersed in liquid He contained in a Dewar vessel, and is connected electrically by a coaxial cable to other semiconductor devices placed in a room temperature.

In such an arrangement of the superconducting devices and the semiconductor devices, the lenght of the coaxial cable must be at least about 1 m, and hence the estimated propagation delay is on the order of 10 ns. It is impossible to drive the superconducting devices, which operate at a high speed, for example, 1 ns or less, when the propagation delay is as large as 10 ns.

SUMMARY OF THE INVENTION

Accordingly, it is an object of the present invention to provide a package for superconducting devices, eliminating the foregoing disadvantages of the prior art and enabling high-speed signal transmission between the semiconductor devices and the superconducting devices.

It is another object of the present invention to provide a package for superconducting devices, capable of suppressing heat transfer from a portion mounted with the semiconductor devices to a portion mounted with the superconducting devices, and capable of encapsulating the superconducting devices with the semiconductor devices disposed near the superconducting devices.

In one aspect of the present invention, a package for electronic devices comprises: heat insulating vacuum vessel means capable of maintaining the interior thereof at a low temperature; a first substrate provided with circuit patterns and having mounted thereon first electronic devices suitable for operation at a low temperature, said first substrate being disposed within the heat insulating vacuum vessel means; a second substrate provided with circuit patterns and having mounted thereon second electronic devices suitable for operation at a room temperature, said second substrate being disposed outside the heat insulating vacuum vessel means; and connecting means penetrating the heat insulating vacuum vessel means to connect electrically the circuit patterns formed respectively on the first substrate and the second substrate.

Desirably, the first substrate and the second substrate are attached to the heat insulating vacuum vessel means substantially in the same plane, and the connecting means is a film cable formed by alternately laminating a plurality of insulating films and a plurality of conductive films. The use of the film cable as the connecting means suppresses the influx of heat from the outside to the inside of the heat insulating vacuum vessel means, so that cooling efficiency in cooling the interior of the heat insulating vacuum vessel means is improved.

When the first electronic devices are, for example, superconducting devices, the heat insulating vacuum vessel means is combined with a cryogenic cooling means for cooling the interior of the heat insulating vacuum vessel means at the operating temperature of the superconducting devices. The heat insulating vacuum vessel means comprises an upper heat insulating vacuum vessel, and a lower heat insulating vacuum vessel separate from the upper heat insulating vacuum vessel. The film cable is attached adhesively to the lower end of upper heat insulating vacuum vessel and to the upper end of the lower heat insulating vacuum vessel. In a modification, the heat insulating vacuum vessel means may comprise a heat insulating vacuum vessel provided with a slit in the middle portion thereof, and a heat insulating vacuum lid adhesively attached to the heat insulating vacuum vessel, and the film cable may be provided in the slit and fixed adhesively to the heat insulating vacuum vessel.

Furthermore, desirably, the first and second substrates are multilayer ceramic substrates each formed by alternately laminating a plurality of circuit patterns for signal transmission, and a plurality of ground patterns.

The above and other objects, features and advantage of this invention and the manner of realizing them will become more apparent, and the invention itself will best be understood, from a study of the following description and appended claims, with reference had to the attached drawings showing some preferred embodiments of the invention.

DESCRIPTION OF THE PREFERRED EMBODIMENTS

Figure 1:
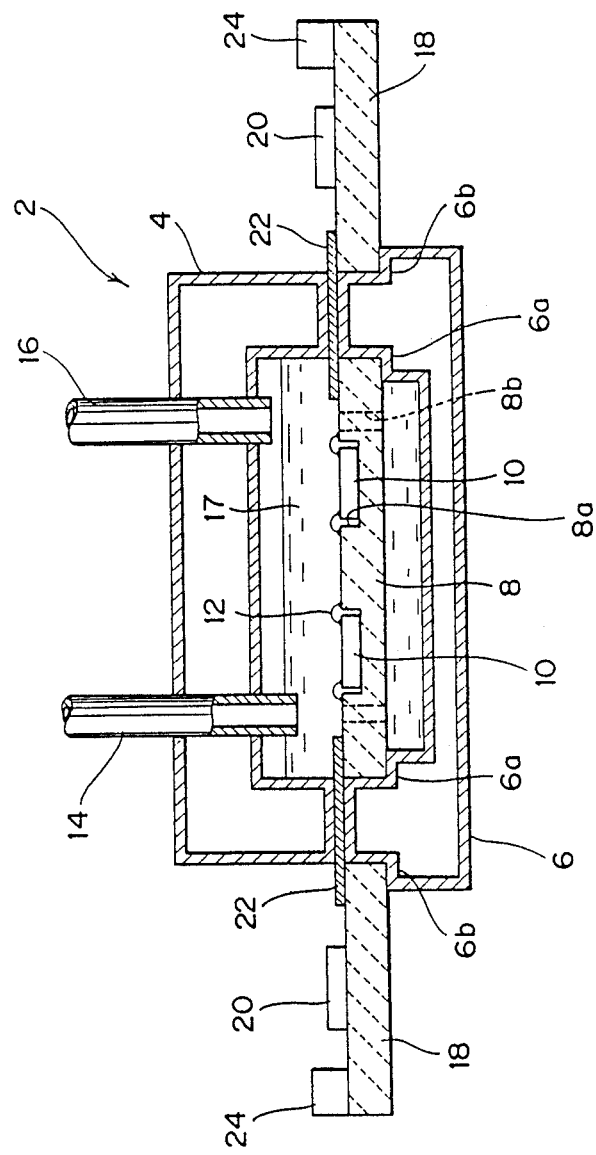
FIG. 1 is a longitudinal sectional view of a package in a preferred embodiment according to the present invention.
Figure 2:
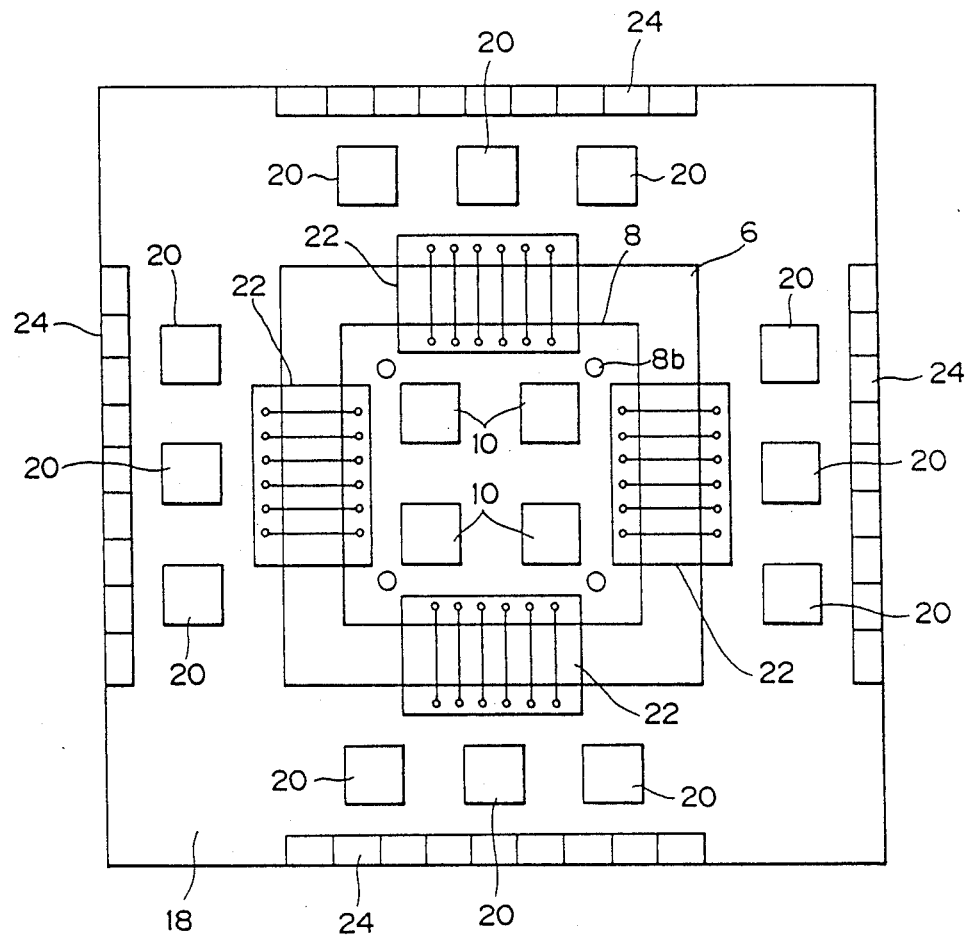
FIG. 2 is a plan view of the package of FIG. 1, in which an upper heat insulating vacuum vessel is removed.

Referring to FIGS. 1 and 2 showing a package for superconducting devices, embodying the present invention, a heat insulating vacuum vessel 2 having the structure of a Dewar vessel is separated into an upper heat insulating vacuum vessel 4 and a lower heat insulating vacuum vessel 6. The upper and lower heat insulating vacuum vessels 4 and 5 are formed, for example, of a FRP (fiber reinforced plastic) or an aluminum alloy. The lower heat insulating vacuum vessel 6 is provided with an inner step 6a and an outer step 6b for supporting substrates. A multilayer ceramic substrate 8 provided with circuit patterns is seated on the inner step 6a. The multilayer ceramic substrate 8 is provided with four recesses 8a for receiving superconducting devices 10, such as Josephson devices, therein, and four through holes 8b to allow a cryogen to flow from an upper cavity formed above the substrate 8 to a lower cavity formed under the substrate 8. Superconducting devices, such as Josephson devices, 10 are placed respectively in the recesses 8a and are bonded to the substrate 8 with silicone grease. The superconducting devices 10 are placed in the recesses 8a with the upper surfaces thereof flush with the upper surface of the multilayer ceramic substrate 8. The superconducting devices 10 are connected electrically to the circuit patterns of the multilayer ceramic substrate 8 by bonding wires 12 formed of an aluminum alloy. Since the upper surface of the superconducting devices 10 and the upper surface of the ceramic substrate 8 are flush with each other, the bonding wires 12 are as short as lengths in the range of 0.2 to 0.4 mm, which is advantageous for high-speed signal transmission.

The upper heat insulating vacuum vessel 4 is provided with a cryogen supply tube 14 and a cryogen discharge tube 16. This embodiment employs liquid helium as a cryogen. Helium gas is liquefied at a temperature of about 4.2K. Liquid helium 17 supplied through the cryogen supply tube 14 flows through the through holes 8b formed in the ceramic substrate 8 into the lower cavity under the ceramic substrate 8. The ceramic substrate 8 and the superconducting devices 10 are immersed in the liquid helium 17.

Figure 5:
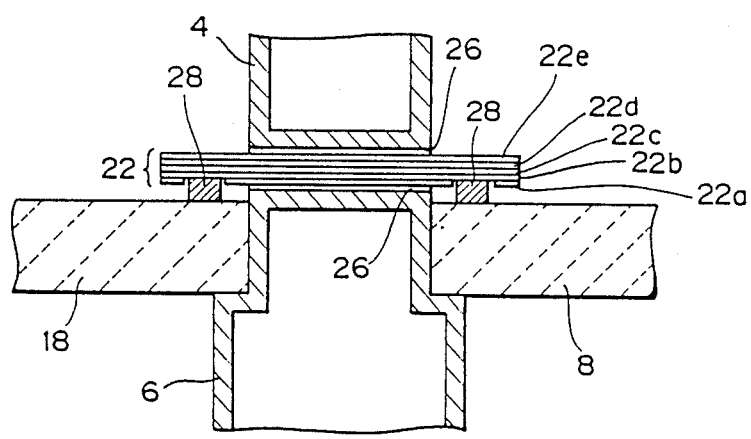
FIG. 5 is an enlarged sectional view of an essential portion of the package of FIG. 1.

A multilayer ceramic substrate 18 for supporting semiconductor devices which operate at a room temperature is seated on the outer step 6b of the lower heat insulating vacuum vessel 6. The multilayer ceramic substrate 18 is provided with circuit patterns, and semiconductor devices 20 of a surface mounting type, such as flat packages and chip carriers, are mounted on the multilayer ceramic substrate 18. The circuit patterns of the multilayer ceramic substrate 8, and those of the multilayer ceramic substrate 18 are connected by film cables (connecting means) 22 as shown in FIG. 5 each formed by laminating a plurality of insulating films and a plurality of conductive films. A plurality of coaxial connectors 24 are mounted detachably on the multilayer ceramic substrate 18.

Figure 3:
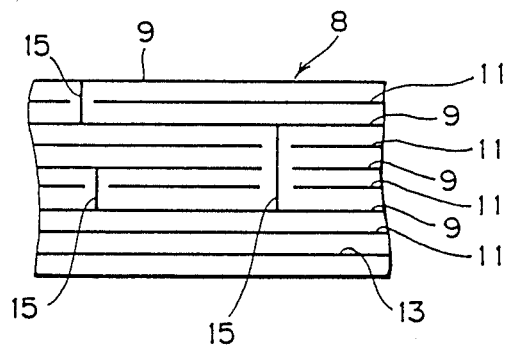
FIG. 3 is a schematic sectional view of a substrate provided within a heat insulating vacuum vessel embodying the present invention.
Figure 4:
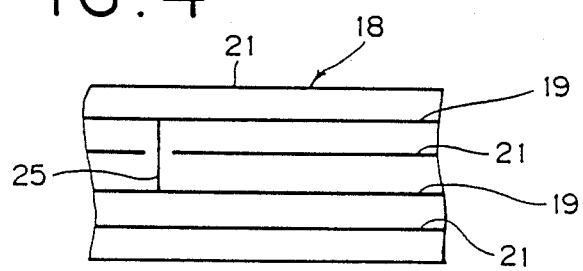
FIG. 4 is a schematic sectional view of a substrate provided outside the heat insulating vacuum vessel.

FIGS. 3 and 4 are schematic sectional views of the multilayer ceramic substrate 8 and 18. Referring to FIG. 3, the multilayer ceramic substrate 8 for mounting the superconducting devices is of a nine-layer structure formed by alternately laminating a plurality of signal patterns 9 and a plurality of ground patterns 11, and attaching a single resistance pattern 13 for terminal matching to the bottom ground pattern 11. The patterns are isolated from each other by a ceramic. The layers of the signal patterns 9, the ground patterns 11 and the resistance pattern 13 are combined integrally to form the multilayer ceramic substrate 8 by burning. The signal patterns 9 are interconnected properly through via holes 15. Referring to FIG. 4, the multilayer ceramic substrate 18 for mounting the semiconductor devices is of a five-layer structure formed by alternately laminating two signal patterns 19 and three ground patterns 21. The signal patterns 19 are interconnected properly through via holes 25. The patterns are isolated from each other by a ceramic. The layers of the signal patterns 19 and the ground patterns 21 are combined integrally to form the multilayer ceramic substrate 18 by burning. The characteristic impedances respectively between the signal patterns 9 and the ground patterns 11 of the multilayer ceramic substrate 8 and between the signal patterns 19 and the ground patterns 21 of the multilayer ceramic substrate 18 are $50\Omega$.

Referring to FIG. 5, the film cable 22 is formed by alternately laminating polyimide films and conductive films formed of copper. That is, the film cable 22 is formed by laminating, from bottom to top, a polyimide films 22a, a signal pattern 22b, a polyimide film 22c, a ground pattern 22d, and a polyimide film 22e. The adjacent polyimide films and the conductive patterns are joined adhesively by an adhesive, such as an epoxy resin.

Basically, the film cable 22 consists of polyimide films and copper foils. The signal pattern 22b can be formed in a structure advantageous for high-speed signal propagation, such as a strip line structure or a coplanar structure, by etching a copper foil. For example, when the signal pattern 22b is 35 $\mu$m thick and 150 $\mu$m wide, and the polyimide film 22c between the signal pattern 22b and the ground pattern 22d is 25 $\mu$m, the characteristic impedance of $50\Omega$ is realized.

The film cable 22 is extended through the upper heat insulating vacuum vessel 4 and the lower heat insulating vacuum vessel 6 and is attached adhesively to the upper heat insulating vacuum vessel 4 and the lower heat insulating vacuum vessel 6 by an adhesive 26, such as an epoxy resin. The signal patterns 9 and 19 of the ceramic substrate 8 and 18 are connected to the signal pattern 22b of the film cable 22 by solder 28. The ground patterns 11 and 21 of the ceramic substrates 8 and 18 are connected to the ground pattern 22d of the film cable 22 by solder at different positions. In view of suppressing the influx of heat, it is preferable that the copper foil forming the ground pattern 22d has the least possible thickness, for example, a thickness on the order of 10 μm. When such a condition is met, the overall thickness of the film cable 22 is on the order of 0.1 mm, so that the quantity of heat that flows from the ceramic substrate 18 through the film cable 22 to the ceramic substrate 8 can be suppressed at a very small value.

Figure 6:
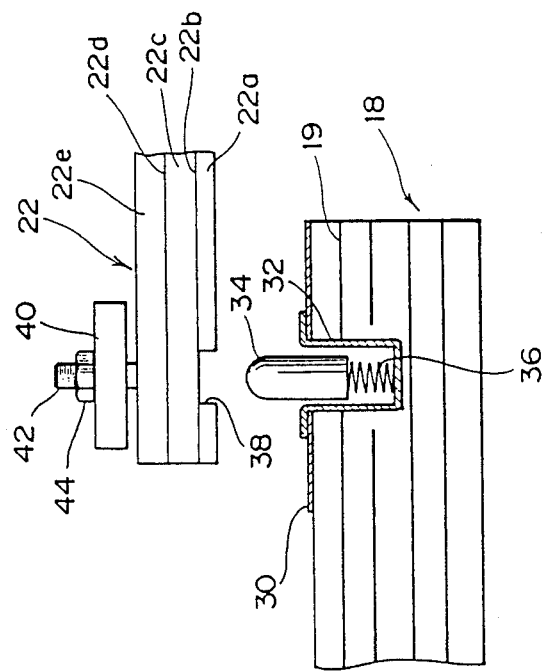
FIG. 6 is a schematic exploded sectional view showing the electrical connection of a film cable and the substrate.
Figure 7:
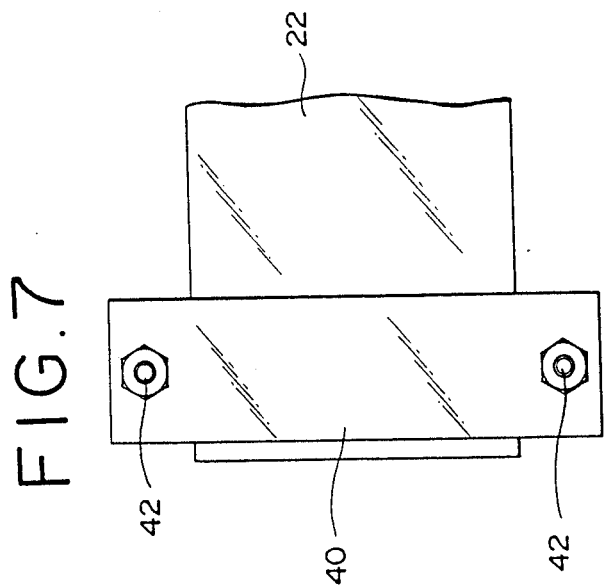
FIG. 7 is a top plan view corresponding to FIG. 6.

Referring to FIGS. 6 and 7 showing another embodiment of connecting means according to the present invention, for connecting the signal pattern of the film cable 22, and the signal patterns of the ceramic substrate 18, an insulating film 30 is formed over the top ground pattern 21 to be connected to the external conductor of the coaxial connector 24 of the ceramic substrate 18, and then a plurality of contact holes for receiving contact pins are formed in the ceramic substrate 18. After forming a conductive film over the surface of the insulating film 30 by metallizing, caps 32 are inserted respectively in the contact holes and are soldered to the conductive film, and a contact pin 34 is put in each cap 32 with a coil spring 36 placed between the contact pin 34 and the bottom of the cap 32 so as to bias the contact pin 34 outward. Thus, each contact pin 34 is connected through the coil spring 36 and the cap 32 to the signal pattern 19 of the ceramic substrate 18.

Through holes 38 are formed in the polyimide film 22a of the film cable 22 at positions respectively corresponding to the contact pins 34 to expose portions of the signal pattern 22b. The film cable 22 is pressed against the ceramic plate 18 with a holding plate 40 by means of stud bolts 42 fixed to the ceramic plate 18, and nuts 44 to connect the signal pattern 22b of the film cable 22 through the contact pins 34, the coil springs 36 and the caps 32 to the signal patterns 19 of the ceramic substrate 18.

Figure 8:
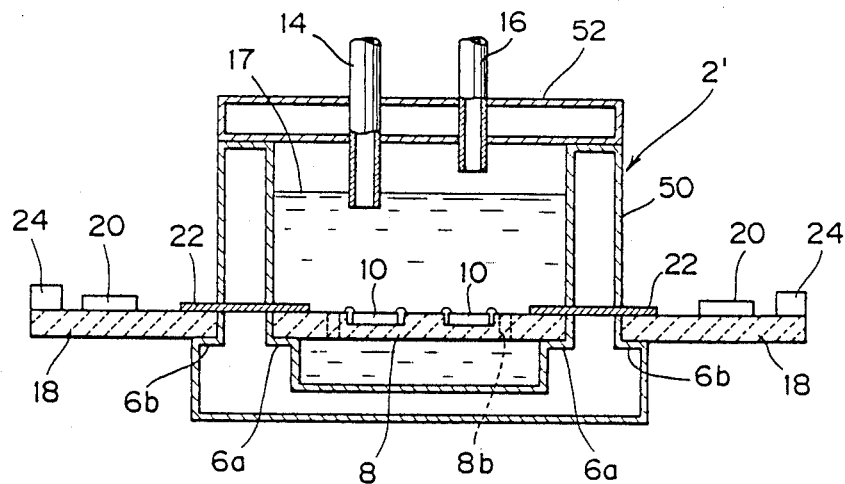
FIG. 8 is a longitudinal sectional view of a package in a further embodiment according to the present invention.
Figure 9:
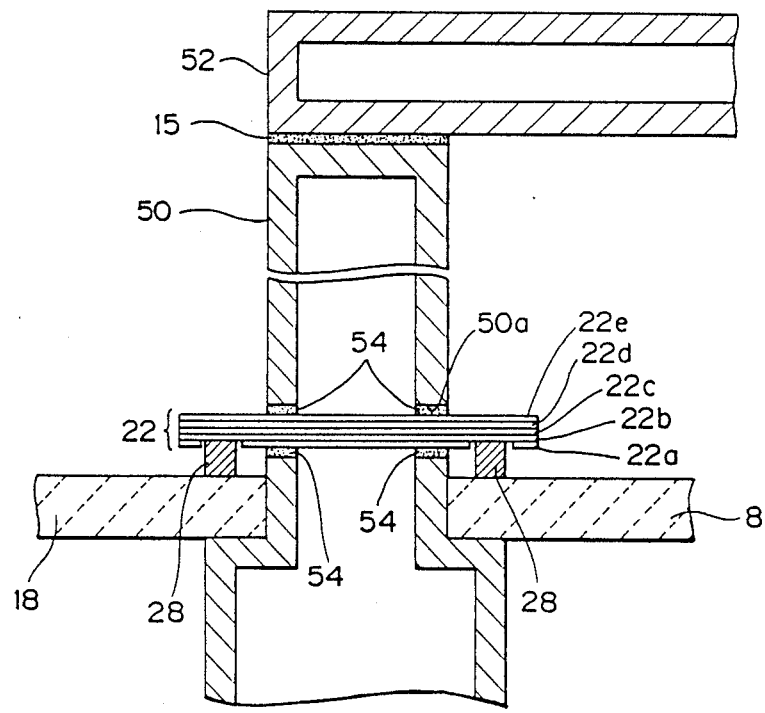
FIG. 9 is an enlarged sectional view of an essential portion of the package of FIG. 8.

A package in a second embodiment according to the present invention will be described hereinafter with reference to FIGS. 8 and 9, in which parts like or corresponding to those of the package in the first embodiment are denoted by the same reference numerals and the description thereof will be omitted to avoid duplication.

The package in the second embodiment differs from the package in the first embodiment in that a heat insulating vacuum vessel 2' consists of a lower heat insulating vacuum vessel 50 having a depth greater than that of the lower heat insulating vacuum vessel 6 of the first embodiment, and a heat insulating vacuum lid 52 attached adhesively to the lower heat insulating vacuum vessel 50, and the film cables 22 are inserted in the heat insulating vacuum vessel 2' respectively through slits 50a formed respectively in the side walls of the lower heat insulating vacuum vessel 50. The film cables 22 must be fastened firmly and closely to the lower heat insulating vacuum vessel 50 in an airtight fashion by filling up gaps between the film cables 22 and the slits 50a with an adhesive 54, such as an epoxy resin, to maintain the interior of the heat insulating vacuum vessel 2' at a vacuum, or the vacuum of the evacuated lower heat insulating vacuum vessel 50 is broken to deteriorate the heat insulating function of the lower heat insulating vacuum vessel.

In the second embodiment, heat is allowed to flow from the outside to the inside of the heat insulating vacuum vessel 2' only through the film cables 22, and hence the capability of the package in the second embodiment in suppressing the inflow of heat is higher than that of the package in the first embodiment shown in FIG. 1. That is, heat flows into the heat insulating vacuum vessel 2 through the walls of the upper heat insulating vacuum vessel 4 and the lower heat insulating vacuum vessel 6 in addition to through the film cables 22 in the first embodiment shown in FIG. 1. Since the heat insulating vacuum vessel 2' in the second embodiment has no wall corresponding to those walls, the influx of heat from outside the heat insulating vacuum vessel 2' is very small. However, since the interior of the lower heat insulating vacuum vessel 50 is isolated from the outside only by means of the adhesive 54 at the slits 50a, the second embodiment, as compared with the first embodiment, has difficulty in maintaining the interior of the lower heat insulating vacuum vessel 50 at a vacuum. The heat insulating vacuum vessel is evacuated at a vacuum by known evacuating means, and hence the description of the process of evacuating the heat insulating vacuum vessel will be omitted.

In the foregoing embodiments, the electronic devices provided within the heat insulating vacuum vessel are connected only through the thin film cables to those disposed outside the heat insulating vacuum vessel, so that the influx of heat generated in the ceramic substrate having the semiconductor devices mounted thereon can be suppressed. Accordingly, the cryogen is consumed at a low rate, and hence, when the cryogen is liquid helium, even a small liquefier is able to answer the purpose. Furthermore, since the superconducting devices and the semiconductor devices can be disposed near to each other, the delay in signal propagation is negligible, so that the superconducting devices can be driven at a high speed.

Although the invention has been described with reference to specific embodiments thereof, the present invention is not limited to those specific embodiments in its practical application and many changes and variations are possible therein. For example, the electronic devices mounted on the ceramic substrate provided within the heat insulating vacuum vessel need not necessarily be superconducting devices, but may be HEMTs (high electron mobility transistors) or the like. Furthermore, the means for electrically connecting the devices provided within the heat insulating vacuum vessel to the external devices is not limited to the film cables, but may be a plurality of coaxial cables. Still further, when the superconducting devices employ superconducting materials of the Y-Ba-Cu-O system which have recently been developed, liquid nitrogen may be used instead of liquid helium for cooling the superconducting devices.

What is claimed is:
1. A package for electronic devices, comprising:
heat insulating vacuum vessel means capable of maintaining the interior thereof at a low temperature:
a first substrate provided with circuit patterns and having mounted thereon first electronic devices suitable for operation at a low temperature, said first substrate being disposed within the heat insulating vacuum vessel means;
a second substrate provided with circuit patterns and having mounted thereon second electronic devices suitable for operation at a room temperature, said second substrate being disposed outside the heat insulating vacuum vessel means, said first and second substrates being attached to said heat insulating vacuum vessel means substantially in the same plane; and connecting means for penetrating the heat insulating vacuum vessel means and electrically connecting the circuit patterns of the first substrate and those of the second substrate.

2. A package for electronic devices according to claim 1, wherein said connecting means is film cable formed by laminating a plurality of insulating films and a plurality of conductive films.

3. A package for electronic devices according to claim 2, wherein said first electronic devices are superconducting devices, and the package further comprises cryogenic cooling means capable of cooling the interior of said heat insulating vacuum vessel means at an operating temperature of the superconducting devices.

4. A package for electronic devices according to claim 3, wherein said heat insulating vacuum vessel means comprises an upper heat insulating vacuum vessel, and a lower heat insulating vacuum vessel separate from the upper heat insulating vacuum vessel, and wherein said film cable is attached adhesively to the lower end of the upper heat insulating vacuum vessel and to the upper end of the lower heat insulating vacuum vessel.

5. A package for electronic devices according to claim 3, wherein said heat insulating vacuum vessel means comprises a heat insulating vacuum vessel provided with a slit in the middle portion of the side wall thereof, and a heat insulating vacuum lid attached adhesively to the heat insulating vacuum vessel, and wherein said film cable is inserted through the slit and is fastened adhesively to the heat insulating vacuum vessel.

6. A package for electronic devices according to claim 3, wherein said first and second substrates are multilayer ceramic substrates each formed by alternately laminating signal transmitting circuit patterns and ground patterns.

7. A package for superconducting devices, comprising:

heat insulating vacuum vessel means capable of maintaining the interior thereof at a low temperature;

a first multilayer ceramic substrate provided with circuit patterns and having mounted thereon superconducting devices, said first multilayer ceramic substrate being disposed within the heat insulating vacuum vessel means;

a second multilayer ceramic substrate provided with circuit patterns and having mounted thereon semiconductor devices, said second multilayer ceramic substrate being disposed outside the heat insulating vacuum vessel means, said first and second ceramic substrates being attached to said heat insulating vacuum vessel means substantially in the same plane;

a film cable for electrically connecting the circuit patterns of the first multilayer ceramic substrate and those of the second multilayer ceramic substrate, inserted into and adhesively attached to the heat insulating vacuum vessel means, said film cable being formed by laminating insulating films and conductive films; and cryogenic cooling means for cooling the interior of the heat insulating vacuum vessel means at an operating temperature of the superconducting devices.

8. A package for superconducting devices according to claim 7, wherein said heat insulating vacuum vessel means comprises an upper heat insulating vacuum vessel and a lower heat insulating vacuum vessel separate from the upper heat insulating vacuum vessel, and wherein said film cable is attached adhesively to the lower end of the upper heat insulating vacuum vessel and to the upper end of the lower heat insulating vacuum vessel.

9. A package for superconducting devices according to claim 7, wherein said heat insulating vacuum vessel means comprises a heat insulating vacuum vessel provided with a slit in the middle portion of the side wall thereof, and a heat insulating vacuum lid adhesively attached to the heat insulating vacuum vessel, and said film cable is inserted in the slit and attached adhesively to the heat insulating vacuum vessel.

* * * * *

UNITED STATES PATENT AND TRADEMARK OFFICE
CERTIFICATE OF CORRECTION

PATENT NO. : 4,980,754
DATED : December 25, 1990
INVENTOR(S) : KOTANI et al

It is certified that error appears in the above-identified patent and that said Letters Patent is hereby corrected as shown below:

On the cover page, please insert the following information:

--[Item 73] Assignee: FUJITSU LIMITED
Kawasaki-shi, Japan

SHINKO ELECTRIC INDUSTRIES CO., LTD.
Nagono-shi, Japan--.

Signed and Sealed this

Fourth Day of August, 1992

*Attest:*

DOUGLAS B. COMER

*Attesting Officer*     *Acting Commissioner of Patents and Trademarks*